United States Patent
Lin et al.

(10) Patent No.: US 8,440,503 B1
(45) Date of Patent: May 14, 2013

(54) METHODS FOR PERFORMING REFLOW IN BONDING PROCESSES

(75) Inventors: Hsiu-Jen Lin, Zhubei (TW); Chih-Wei Lin, Xinfeng Township (TW); Cheng-Ting Chen, Taichung (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/298,056

(22) Filed: Nov. 16, 2011

(51) Int. Cl.
*H01L 21/00* (2006.01)

(52) U.S. Cl.
USPC ............ 438/108; 438/110; 438/127; 438/460; 438/462

(58) Field of Classification Search .................. 438/106, 438/107, 108, 110, 112, 113, 127, 460, 462; 257/678, 778, 787
See application file for complete search history.

(56) References Cited

U.S. PATENT DOCUMENTS

| | | | | |
|---|---|---|---|---|
| 6,548,330 | B1 * | 4/2003 | Murayama et al. | 438/127 |
| 6,696,764 | B2 * | 2/2004 | Honda | 257/778 |
| 6,933,173 | B2 * | 8/2005 | Yunus | 438/110 |
| 7,041,531 | B2 * | 5/2006 | Wang | 438/106 |
| 2002/0053745 | A1 * | 5/2002 | Lin | 257/778 |
| 2005/0009237 | A1 * | 1/2005 | Yamaguchi | 438/114 |
| 2010/0227170 | A1 * | 9/2010 | Endo et al. | 428/413 |

OTHER PUBLICATIONS

Lee, M., et al., "Study of Interconnection Process for Fine Pitch Flip Chip," 2009 Electronic Components and Technology Conference, pp. 720-723.

* cited by examiner

*Primary Examiner* — Jarrett Stark
*Assistant Examiner* — John M Parker
(74) *Attorney, Agent, or Firm* — Slater & Matsil, L.L.P.

(57) ABSTRACT

A method includes placing a cover over a lower package component, wherein the cover comprises an opening aligned to the lower package component. An upper package component is placed over the lower package component. The upper package component is aligned to the opening, and a solder region is dispose between the upper package component and the lower package component. The cover and the upper package component are exposed to a radiation to reflow the solder region.

19 Claims, 7 Drawing Sheets

METHODS FOR PERFORMING REFLOW IN BONDING PROCESSES

BACKGROUND

Integrated circuits are formed on semiconductor wafers, which are then sawed into semiconductor chips. The semiconductor chips may be bonded onto package substrates. During the bonding process, the solder regions between the semiconductor chips and the package substrates are reflowed. Conventional reflow methods include convection-type reflow and thermal compressive reflow. The convection-type reflow has relatively high throughput since a plurality of package substrates and the overlying dies may be bonded through the reflow at the same time. However, the convection-type reflow requires a long period of time to heat solder bumps. The resulting high thermal budget may cause significant warpage in semiconductor chips and the package substrates. As a result, cold joints may be resulted, and hence the semiconductor chips may have defective electrical connection to the corresponding package substrates. The solder regions may also have bridges. The delamination between low-k dielectric layers in the chips may also be resulted due to the stress as a result of the warpage.

The thermal compressive bonding requires a lower thermal budget than the convection-type reflow. However, the thermal compressive bonding has a very low throughput. During the thermal compressive bonding, a bond head picks up a chip, flips the chip, and attaches the chip to a package substrate. The bond head then goes through a temperature ramp-up process to heat the chip and the solder bumps that join the chip and the underlying package substrate. After the solder bumps are molten, the bond head goes through a cool-down process so that the solder bumps may solidify. This process is repeated for each of the chips, and hence the throughput of the thermal compressive bonding is very low, which sometimes may be only 1/15 of the throughput of the convection-type reflow.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 5 are cross-sectional views and top views of intermediate stages in the manufacturing of a package in accordance with various embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Methods for forming packages are provided in accordance with embodiments. The intermediate stages in the manufacturing of a package are provided. Variations of the embodiments are discussed. Throughout the various views and illustrative embodiments, like reference numbers are used to designate like elements. It is appreciated that the embodiments shown in FIGS. 1A through 5 are merely exemplary embodiments, and more embodiments may be developed based on the teaching of the exemplary embodiments.

Figure 1A:
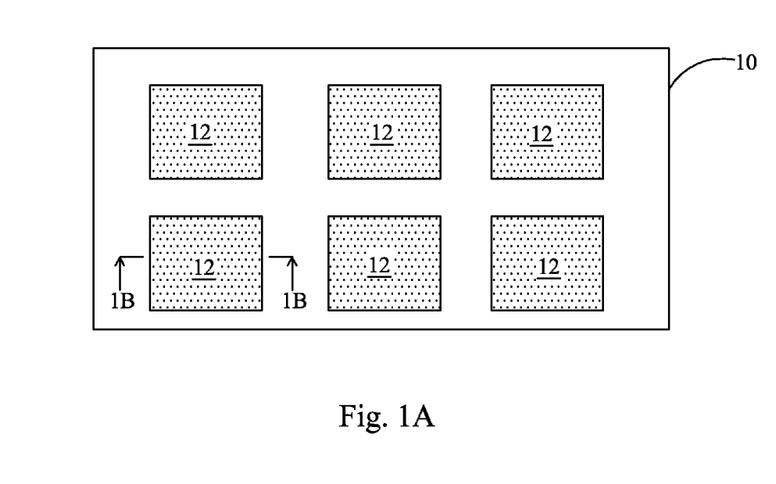

FIG. 1A illustrates a top view of a portion of package component 10, which further includes a plurality of package components 12 therein. Package component 10 may be a package substrate strip, and hence is referred to as package substrate strip 10 hereinafter, although package component 10 may be another type of package component such as an interposer wafer. Package components 12 are accordingly referred to as package substrates 12 hereinafter. In accordance with embodiments, package substrate strip 10 includes a plurality of package substrates 12 therein. Package substrate 12 may be identical to each other. The dielectric material between package substrates separates package substrate 12 from each other. In some embodiments, package substrates 12 are distributed uniformly throughout package substrate strip 10, and may be arranged with a pattern of an array. In other embodiments, package substrates 12 may be disposed as a plurality of groups, with the inter-group spacing between the groups greater than the inner-group spacing between package substrates 12 that are in the same group. Although the illustrated embodiment illustrates package substrate strip 10 as having a rectangular top-view shape, in alternative embodiments, package substrate strip 10 may have a round top-view shape.

Figure 1B:
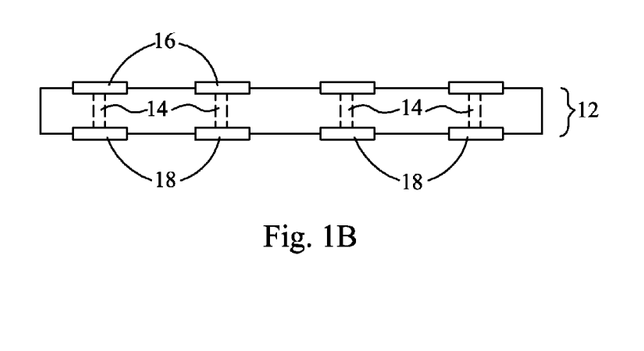

FIG. 1B schematically illustrates a cross-sectional view of one of package substrates 12, wherein the cross-sectional view is obtained from the plane crossing line 1B-1B in FIG. 1A. A plurality of connectors 16, which may be solder balls, pre-solder regions, metal pads, or non-reflowable metal bumps, is formed on a side of package substrate 12. Connectors 16 are electrically coupled to metal features such as bond pads 18 on the opposite side of package substrate 12. Dashed lines 14 represent the electrical coupling between features 16 and 18, and may include a plurality of metal lines and vias interconnecting the metal lines.

Figure 2A:
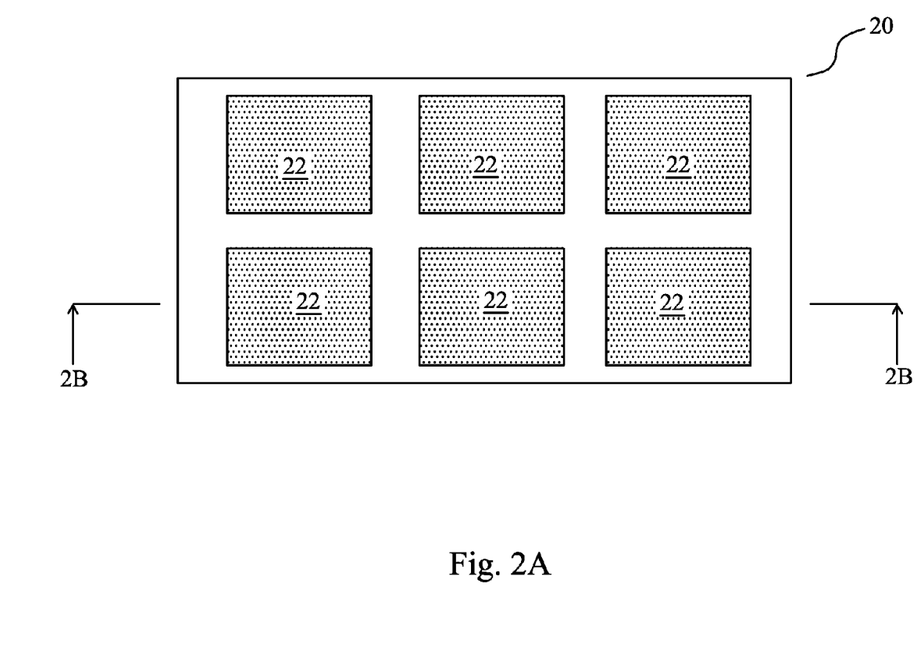

FIG. 2A illustrates a top view of cover 20 in accordance with some embodiments. Cover 20 may have a rectangular shape, and may have substantially the same top-view size and/or the same top-view shape as package substrate strip 10 (FIG. 1A). Alternatively, cover 20 may have a top-view size greater than the top-view size of package component 10. Cover 20 may include a plurality of through-openings 22, which are allocated in such a way that when cover 20 is placed on package substrate strip 10, through-openings 22 may be aligned to package substrates 12. The size of each of through-openings 22 may be great enough to allow one package component 40 (FIGS. 3A and 3B) to be placed therein. Furthermore, the size and the shape of through-openings 22 may be close to the size and shape of the subsequently placed package component 40 (FIGS. 3A and 3B).

Figure 2B:
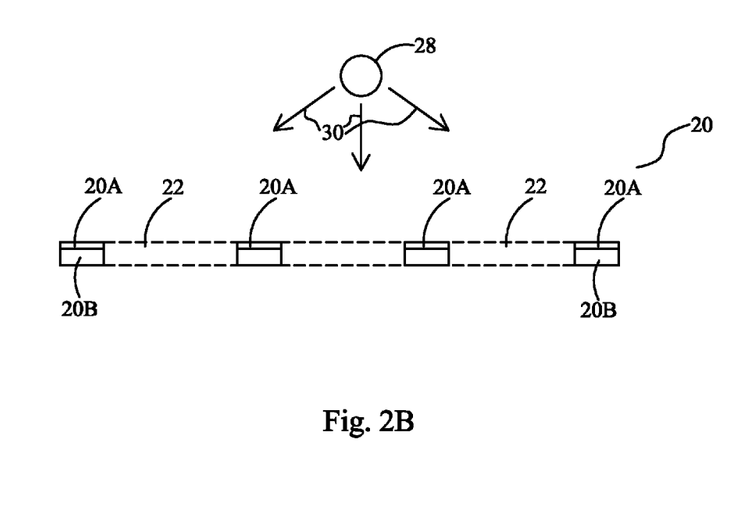

FIG. 2B illustrates a cross-sectional view of cover 20, wherein the cross-sectional view is obtained from the plane crossing line 2B-2B in FIG. 2A. In an exemplary embodiment, cover 20 includes a top surface layer 20A, which has a high reflectivity to radiation 30, which is radiated from radiation source 28. Radiation source 28 is schematically illustrated in FIG. 2B. Top surface layer 20A may expand to the entire, or substantially entire, top surface of cover 20. In some embodiments, top surface layer 20A and the underlying layer(s) 20B of cover 20 are formed of different materials. For example, top surface layer 20A may comprise silver, aluminum, gold, copper, tin, iron, aluminum oxide ($Al_2O_3$), combinations thereof, and/or multi-layers thereof. Layer(s) 20B, on the other hand, may comprise a metal different from the metal of top surface layer 20A, an organic material, a ceramic, or the like. Top surface layer 20A may be coated on layer(s) 20B, for example, through electro or electro-less plating, or through Physical Vapor Deposition (PVD). In alternative embodiments, the entire cover 20 is formed of a homogenous material, which may also comprise silver, aluminum, gold, copper, tin, iron, aluminum oxide ($Al_2O_3$), combinations thereof, and/or multi-layers thereof.

The reflectivity of top surface layer 20A to radiation 30 may be greater than about 90 percent, greater than about 95 percent, or greater than about 98 percent. Radiation source 28 may be an infrared lamp, which may emit infrared light 30 having wavelengths between about 750 nm and about 3,000 nm, for example. Alternatively, other types of radiation sources such as Halogen lamp may be used. It is appreciated that the reflectivity of top surface layer 20A is related to the wavelengths of radiation 30. Accordingly, in order to achieve a high reflectivity, the material of top surface layer 20A may be selected according to the type of radiation source 28. For example, when top surface layer 20A is a silver layer, the reflectivity of top surface layer 20A to infrared light 30 is greater than about 98 percent.

Figure 3A:
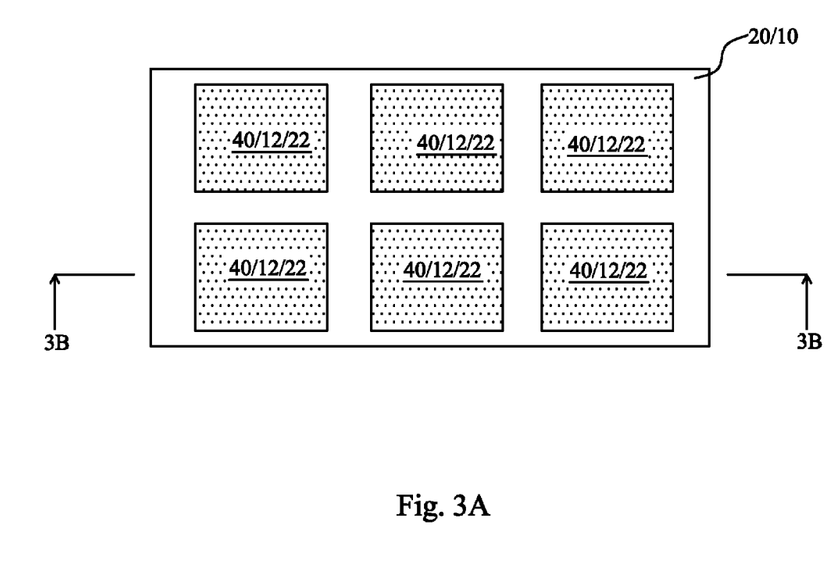
Figure 3B:
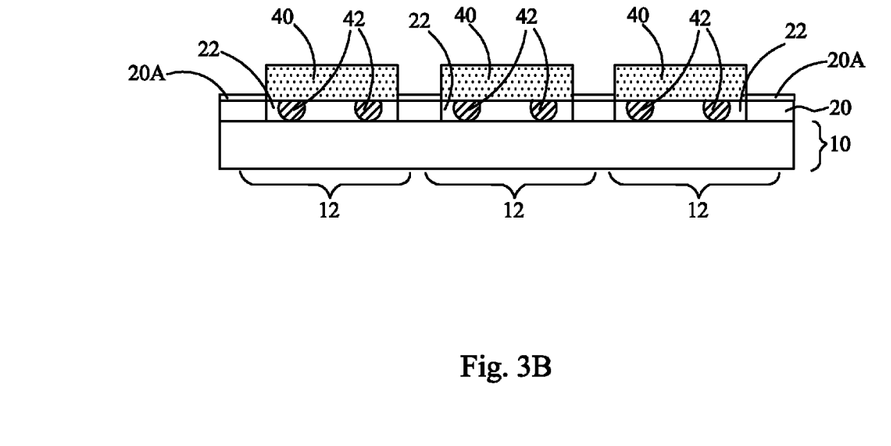

FIGS. 3A and 3B illustrate a top view and a cross-sectional view, respectively, of the placement of package components 40 on package substrates 12. In some embodiments, cover 20 is placed over, and aligned to, package substrate strip 10. Package substrates 12 in package substrate strip 10 are aligned to through-openings 22 (FIG. 3B). Package components 40 are then placed on package substrates 12. Throughout the description, package substrate strip 10 is alternatively referred to as a lower package component strip, and package substrates 12 are referred to as lower package components. Package components 40 are also referred to as upper package components. In some embodiments, package components 40 are device dies, and are alternatively referred to as device dies 40 hereinafter, although package components 40 may also be packages, interposers, or the like. Device dies 40 are placed into through-openings 22 of cover 20, wherein each of device dies 40 is placed into one of through-openings 22. The top-view sizes (FIG. 3A) of device dies 40 may be substantially close to, and may be slightly smaller than, the top-view sizes of through-openings 22, so that device dies 40 may be placed into through-openings 22. After the placement of device dies 40, package substrate strip 10 is substantially fully covered by cover 20 and device dies 40.

FIG. 3B illustrates a cross-sectional view of the structure shown in FIG. 3A, wherein the cross-sectional view is obtained from the plane crossing line 3B-3B in FIG. 3A. Solder regions 42 may be disposed between device dies 40 and package substrates 12. Solder regions 42 may be solder balls, solder caps formed on metal pillars, or the like. Solder regions 42 may be pre-formed on device dies 40, package substrates 12, or both device dies 40 and package substrates 12. After the placement of each of device dies 40, a small pressure may be applied to press the respective device die 40 against the corresponding underlying package substrate 12.

Figure 4:
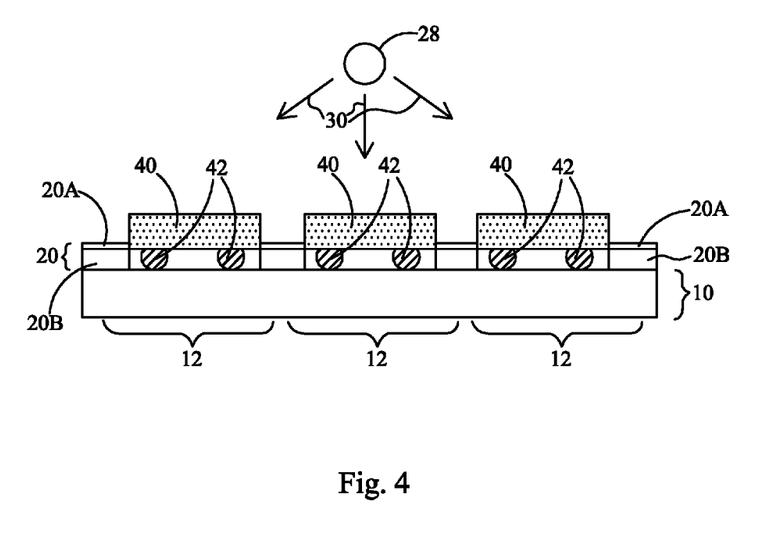

Referring to FIG. 4, with all through-openings 22 of cover 20 placed with device dies 40, device dies 40 and cover 20 are exposed to radiation 30, which is emitted from radiation source 28. The back surface material of device dies 40 may have a reflectivity (to radiation 30) lower about 40 percent, or lower than about 30 percent. The reflectivity of the back surface material of device dies 40 may be lower than the reflectivity of top surface layer 20A of cover 20. For example, when the back surface material of device dies 40 comprises crystalline silicon, and if the infrared light (with wavelength between about 750 nm and about 3,000 nm) is emitted, the reflectivity of the back surfaces of device dies 40 to radiation 30 may be about 37 percent. The reflectivity of device dies 40 may be smaller than the reflectivity of the top surface layer 20A by greater than about 10 percent, or by greater than about 20 percent. Accordingly, device dies 40 may absorb the energy of radiation 30 in a reasonably high rate. The temperature of device dies 40 thus rises quickly. In the meantime, the rise in the temperature of cover 20 is much slower. The resulting heat in device dies 40 is conducted to solder regions 42, and causes the melting of solder region 42. Solder regions 42 are thus reflowed.

Since the radiation energy of radiation 30 is blocked by cover 20 and cannot reach package substrate strip 10 directly, package substrates 12 receive the heat through the conduction of the solder regions 42, instead of from radiation 30 directly. As a result, the temperatures of package substrates 12 are significantly lower than the temperatures of device dies 40. For example, the temperature difference between the temperature on the back surfaces of device dies 40 and package substrates 12 may be as high as about 150° C. After the melting of solder region 42, the radiation of the energy is stopped, and the molten solder regions 42 may solidify. Device dies 40 are thus bonded to package substrates 12 through solder regions 42.

Figure 5:
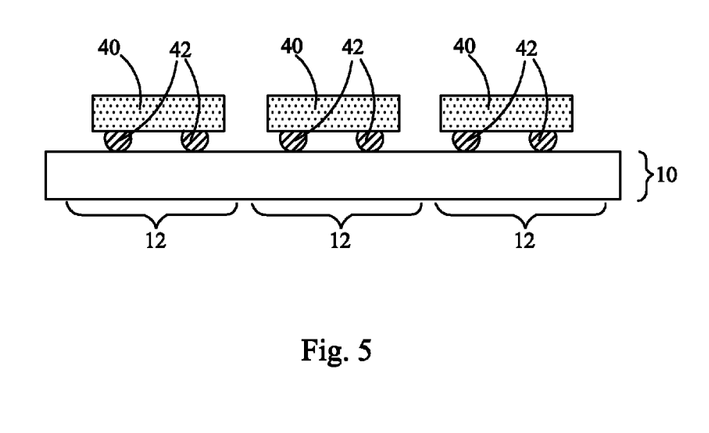

In some embodiments, by using the 750 nm-3,000 nm infrared light to perform the reflow, the duration of the reflow process may be less than about 30 seconds, and may be less than about 10 seconds. The throughput of the reflow process is thus improved. After the reflow process, cover 20 may be taken away from over package substrates 12. The resulting package is shown in FIG. 5.

In above-described embodiments, cover 20 is placed over package substrate strip 10 first, followed by the placement of device dies 40. In alternative embodiments, the order is reversed, and device dies 40 are placed on package substrates 12 first, followed by the placement of cover 20 over package substrate strip 10. The reflow is then performed. After the reflow, cover 20 may be removed from over package substrate strip 10.

In the embodiments, during the reflow process, by blocking the radiation from reaching package substrate strip 10 (FIG. 4), while allowing device dies 40 to be heated by the radiated energy, the temperature of package substrates 12 is much lower than that of device dies 40. Accordingly, the warpage of package substrates 12 is reduced, and the cold joints (defect joints) of solder regions 42 to package substrates 12 and/or device dies 40 are reduced. Furthermore, with the reduction in the warpage of package substrates 12, the stress occurring to the low-k dielectric layers (if any) in device dies 40 is also reduced, and the delamination of the low-k dielectric layers is reduced. With cover 20 having a high reflectivity, during and after the reflow process, cover 20 remains to be at a low temperature.

In accordance with embodiments, a method includes placing a cover over a lower package component, wherein the cover comprises an opening aligned to the lower package component. An upper package component is placed over the lower package component. The upper package component is aligned to the opening, and a solder region is dispose between the upper package component and the lower package component. The cover and the upper package component are exposed to a radiation to reflow the solder region.

In accordance with other embodiments, a cover is placed over a package substrate strip including a plurality of package substrates therein. The cover includes a plurality of openings, each aligned to one of the plurality of package substrates. A plurality of device dies is placed into the plurality of openings. Each of the plurality of device dies is placed over one of the plurality of package substrates. Solder regions between the plurality of device dies and the plurality of package substrates are reflowed by exposing the cover and the plurality of device dies to an infrared light. The cover is removed from the package substrate strip after the step of reflowing.

In accordance with yet other embodiments, a method includes placing an upper package component over a lower package component. A solder region is disposed between the upper package component and the lower package component.

The upper package component is exposed to a radiation to reflow the solder region. During the step of exposing, the radiation is blocked from reaching the lower package component.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   placing a cover over a lower package component, wherein the cover comprises an opening aligned to the lower package component;
   placing an upper package component over the lower package component, wherein the upper package component is aligned to the opening, and wherein a solder region is dispose between the upper package component and the lower package component;
   exposing the cover and the upper package component to a radiation to reflow the solder region; and
   moving the cover away from over the upper package component after the step of exposing the cover and the upper package component to the radiation.

2. The method of claim 1, wherein the step of exposing the cover and the upper package component to the radiation comprises emitting an infrared light onto the cover and the upper package component.

3. The method of claim 2, wherein the infrared light has a wavelength between about 750 nm and about 3,000 nm.

4. The method of claim 1, wherein the lower package component is comprised in a package component strip that further comprises a plurality of lower package components, wherein the cover further comprises a plurality of openings aligned to the plurality of lower package components, and wherein the method further comprises placing a plurality of upper package components over the plurality of lower package components, with each of the upper package components aligned to one of the plurality of openings.

5. The method of claim 1, wherein a top surface of the cover has a first reflectivity, and wherein a top surface of the upper package component has a second reflectivity lower than the first reflectivity.

6. The method of claim 5, wherein the first reflectivity is greater than the second reflectivity by higher than about 10 percent.

7. The method of claim 1, wherein during the step of exposing the cover and the upper package component, a top surface layer of the cover exposed to the radiation comprises a material selected from the group consisting essentially of silver, aluminum, gold, copper, tin, iron, aluminum oxide ($Al_2O_3$), and combinations thereof.

8. The method of claim 1, wherein the lower package component comprises a package substrate, and wherein the upper package component comprises a device die.

9. A method comprising:
   placing a cover over a package substrate strip comprising a plurality of package substrates therein, wherein the cover comprises a plurality of openings, each aligned to one of the plurality of package substrates;
   placing a plurality of device dies into the plurality of openings, wherein each of the plurality of device dies is placed over one of the plurality of package substrates;
   reflowing solder regions between the plurality of device dies and the plurality of package substrates by exposing the cover and the plurality of device dies to an infrared light; and
   removing the cover from the package substrate strip after the step of reflowing.

10. The method of claim 9, wherein after the step of placing the plurality of device dies, substantially no portion of the package substrate strip is exposed to the infrared light.

11. The method of claim 9, wherein the cover comprises a top layer, and wherein the top layer comprises silver.

12. The method of claim 9, wherein the cover has a first reflectivity to the infrared light, exposed surfaces of the plurality of device dies have a second reflectivity to the infrared light, and wherein the first reflectivity is greater than the second reflectivity.

13. The method of claim 12, wherein a difference between the first reflectivity and the second reflectivity is greater than about 10 percent.

14. A method comprising:
   placing an upper package component over a lower package component, wherein a solder region is disposed between the upper package component and the lower package component;
   exposing the upper package component to a radiation to reflow the solder region, wherein during the step of exposing, the radiation is blocked from reaching the lower package component by a cover; and
   after the step of exposing the upper package component to the radiation, removing the cover from over the lower package component.

15. The method of claim 14, wherein the cover has a higher reflectivity to the radiation than a surface of the upper package component.

16. The method of claim 14, wherein the step of exposing the upper package component to the radiation comprises emitting an infrared light onto the cover and the upper package component.

17. The method of claim 16, wherein the infrared light has a wavelength between about 750 nm and about 3,000 nm.

18. The method of claim 14, wherein a top surface layer of the cover exposed to the radiation comprises a material selected from the group consisting essentially of silver, aluminum, gold, copper, tin, iron, aluminum oxide ($Al_2O_3$), and combinations thereof.

19. The method of claim 14, wherein the lower package component comprises a package substrate, and wherein the upper package component comprises a device die.

* * * * *